United States Patent [19]

Saha et al.

[11] Patent Number: 6,049,662

[45] Date of Patent: Apr. 11, 2000

[54] SYSTEM AND METHOD FOR MODEL SIZE REDUCTION OF AN INTEGRATED CIRCUIT UTILIZING NET INVARIANTS

[75] Inventors: Avijit Saha; James D. Christian; William M. Canfield; Greg N. Fife; Nadeem Malik, all of Austin, Tex.

[73] Assignee: International Business Machines Corporation, Armonk, N.Y.

[21] Appl. No.: 08/790,261

[22] Filed: Jan. 27, 1997

[51] Int. Cl.[7] ................................................ G06F 17/50
[52] U.S. Cl. .............................. 395/500.37; 395/500.38; 395/500.23; 714/33
[58] Field of Search ............................. 364/578, 488, 364/489, 490; 395/500, 500.35, 500.37, 500.38; 371/22.1, 22.3, 27; 714/33, 715, 724, 728

[56] References Cited

U.S. PATENT DOCUMENTS

| | | | |
|---|---|---|---|
| 4,763,289 | 8/1988 | Barzilai et al. | 364/578 |
| 4,801,870 | 1/1989 | Eichelberger et al. | 324/73 R |
| 4,916,612 | 4/1990 | Chin et al. | 364/424.01 |
| 4,985,860 | 1/1991 | Vlach | 364/578 |
| 5,053,980 | 10/1991 | Kanazawa | 364/578 |
| 5,163,016 | 11/1992 | Har'El et al. | 364/578 |
| 5,291,427 | 3/1994 | Loyer et al. | 364/578 |
| 5,384,720 | 1/1995 | Ku et al. | 364/578 |
| 5,392,227 | 2/1995 | Hiserote | 364/578 |
| 5,446,652 | 8/1995 | Peterson et al. | 364/578 |
| 5,446,676 | 8/1995 | Huang et al. | 364/578 |
| 5,452,239 | 9/1995 | Dai et al. | 364/578 |
| 5,462,768 | 10/1995 | Adkins et al. | 427/265 |
| 5,467,462 | 11/1995 | Fujii | 364/578 |
| 5,475,832 | 12/1995 | Shoji et al. | 395/500 |
| 5,553,008 | 9/1996 | Huang et al. | 364/578 |
| 5,596,585 | 1/1997 | Njinda et al. | 371/22.5 |
| 5,640,546 | 6/1997 | Gopinath et al. | 395/551 |
| 5,781,764 | 7/1998 | Degeneff et al. | 395/500 |
| 5,784,593 | 7/1998 | Tseng et al. | 395/500 |

*Primary Examiner*—Kevin J. Teska
*Assistant Examiner*—Thai Phan
*Attorney, Agent, or Firm*—Sawyer & Associates; Volel Emile

[57] ABSTRACT

The present invention provides a system and method for verifying an integrated circuit model. The model includes a plurality of net variables. The system and method comprises generating a plurality of tests for simulating the integrated circuit, precalculating a reduced model based upon the generated tests, and evaluating the reduced model. In a preferred embodiment, the present invention includes restricting the test that are generated. Then net invariants for the integrated circuit are generated by translating the restricted plurality of tests to a smaller set of possible values for the net variables. Thereafter, a minimization algorithm or procedure is utilized to minimize the logic used in the particular system based upon the latch constraints. This system produces a reduced model which reduces the amount of the integrated circuit that must be simulated thereby increasing the simulation speed thereof. Accordingly, the present invention integrates an event-driven simulation and a cycle simulation in such a manner that the saving can be proportional to the size of the reduction of the model. In many environments this reduction is significant because it allows for a significant reduction in space which has a clear bearing on the verification process.

18 Claims, 2 Drawing Sheets

SYSTEM AND METHOD FOR MODEL SIZE REDUCTION OF AN INTEGRATED CIRCUIT UTILIZING NET INVARIANTS

TECHNICAL FIELD

The present invention is related to simulation and/or emulation of integrated circuits, and more particularly to a system and method for reducing the size of such for simulation, emulation or for other purposes.

BACKGROUND

Simulation and/or emulation of an integrated circuit is a primary vehicle for design verification of an integrated circuit, particularly one that includes random logic. Typically, simulation and/or emulation of an integrated circuit is relatively expensive and time consuming. Model sizes pose severe restrictions on every form of verification be it simulation, emulation, or formal verification. For instance, simulation resource requirements are a function of the model size. In the case of large multi-processor systems, it may take months to simulate the design for all the planned test programs on a set of resources. If the model size is reduced by half then the time or the resource requirement is also reduced by 50%. This translates to significant dollar amount in savings. In some instances pre-silicon verification efforts are abandoned simply because the model size was too large for the resources to handle. Escalating complexity of modern digital designs is destined to make these problems even more acute.

There are two types of simulators, cycle simulators and event driven simulators. A cycle simulator evaluates all similar gates in the design driving each cycle. An event driven simulator, on the other hand, evaluates a portion of the logic only when triggered by an event that actually affects that logic. In event driven simulators, an event history table is needed to track the relationships of the different portions of the logic that are to be implemented. This table can become extremely large when simulating an integrated circuit that includes random logic. This table is very large in this instance because there may be many competing events happening in the integrated circuit.

Hence, typically cycle simulators are faster for most cases than event-driven simulators. However, to evaluate all gates for each cycle as is required in cycle simulators becomes very time consuming and expensive. This is particularly true, in complex designs such as multiprocessing architectures and the like.

What is needed therefore is a system that can reduce the overall expense and also increase the speed of simulating particular types of integrated circuits. In addition, the simulation system and method should be one which significantly reduces the model size by a factor over the prior art. The present invention addresses such a need.

SUMMARY

The present invention provides a system and method for verifying an integrated circuit model. The model includes a plurality of net variables. The system and method comprises generating a plurality of tests for simulating the integrated circuit, precalculating a reduced model based upon the generated tests, and evaluating the reduced model.

In a preferred embodiment, the present invention includes restricting the tests that are generated. Then net invariants for the integrated circuit are generated by translating the restricted tests to a smaller set of possible values for the net variables. Note that a smaller set of possibilities for net variables can occur naturally and not strictly from test restrictions. Thereafter, a minimization algorithm or procedure is utilized to minimize the logic used in the particular system based upon the reduced set of values for the net variables. This system produces a reduced model which reduces the amount of the integrated circuit that must be simulated thereby increasing the simulation speed thereof. Accordingly, the present invention integrates an event-driven simulation and a cycle simulation in such a manner that the saving can be proportional to the size of the reduction of the model. In many environments this reduction is significant because it allows for a significant reduction in space which has a clear bearing on the verification process.

DETAILED DESCRIPTION

The present invention is directed toward an improvement in simulation of integrated circuits. The following description is presented to enable one of ordinary skill in the art to make and use the illustrative embodiment and is provided in the context of a patent application and its requirements. Various modifications to the illustrative embodiment will be readily apparent to those skilled in the art and the generic principles herein may be applied to other embodiments. Thus, the illustrative embodiment is not intended to be limited to the embodiment shown but is to be accorded the widest scope consistent with the principles and features described herein.

An integrated circuit model (M) can be represented by:

$$M < (L, f_i)$$

where L is a complete set of net variables and $f_i$ is the set of boolean functions of the corresponding set of net variables in terms of other net variables, external variables and outputs. In most emulation platforms there is a desire to reduce the size of the integrated circuit model size of an integrated circuit, increase the coverage or the amount of logic tested for the circuit and at the same time minimize the overall costs of such a circuit. In many instances there are different types of instructions that are of interest when performing simulation of a particular integrated circuit.

For example, in a multiprocessor architecture, the instructions that affect memory may be the ones that are simulated to ensure the overall efficiency of the particular architecture. In another instance, the instructions of the floating point unit within a processor architecture is not utilized in a particular application. However, using conventional simulation techniques portions of the design pertaining to those instructions would still be evaluated.

Therefore, what is needed is a system that can allow for simulation of an integrated circuit in an efficient and effective manner while at the same time not requiring unnecessary evaluation of irrelevant logic resulting from constant or unused parameters hereinafter referred to as net invariants.

Figure 1:
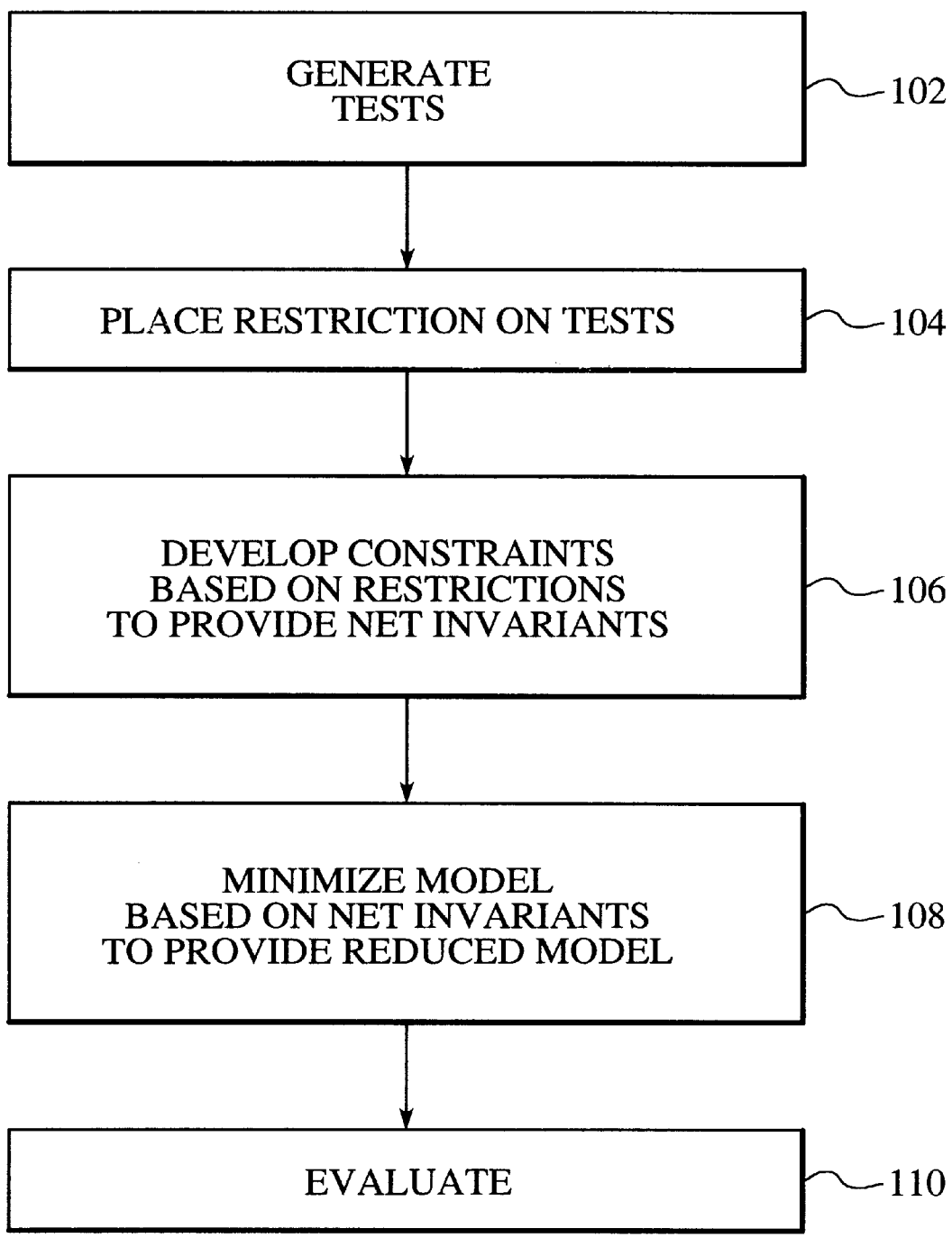
FIG. 1 is a flow chart showing the operation of the simulation system in accordance with the present invention.

The present invention provides for the integration of event driven simulation and cycle simulation in an efficient manner to provide for an improved process that reduces costs in simulation by taking into account these net invariants. The present invention obtains a reduced model from a general model by precalculating portions of a design given a class of tests since the class of tests will exercise only a portion of the entire model. The savings are then proportional to the difference between that reduced model and the original model. In many cases, this difference can be significant because the proportionality may be of an order of magnitude or greater. To more particularly describe the key features of the present invention, refer now to FIG. 1, which is a flow diagram of an automatic size reduction of an integrated circuit in accordance with the present invention.

Firstly, a plurality of tests for the integrated circuit are generated, via step 102. These tests are utilized to determine the correctness of a particular design. Next, there are a series of restrictions placed on the tests based upon characteristics of the integrated circuit and aspect of the design being tested, via step 104. These test restrictions are used to improve the verification process by increasing the speed of simulation while at the same time reducing the amount of the model which must be simulated. An example of one type of restriction is partitioning the tests into a plurality of categories. For example, the circuit can be partitioned by function or some other designation. Thereafter, for example, one of the categories can be identified based upon the use of the circuit.

Every design can at the lowest level be broken down into latches and the combinational circuit that drives the input to these latches. The combinational circuit is a function of the latch outputs and external inputs. Test restrictions can be translated to constraints on the values of the outputs of latches or constraints on the external inputs. These constraints are the net invariants.

Hence, the latches are constrained based upon functional or natural properties of those latches, via step 106. For example, there must be certain latches within the group of tests that are not utilized, whose values are known to be limited to a smaller subset of possible values. In this example, this group of latches would provide the net invariants.

Figure 2:
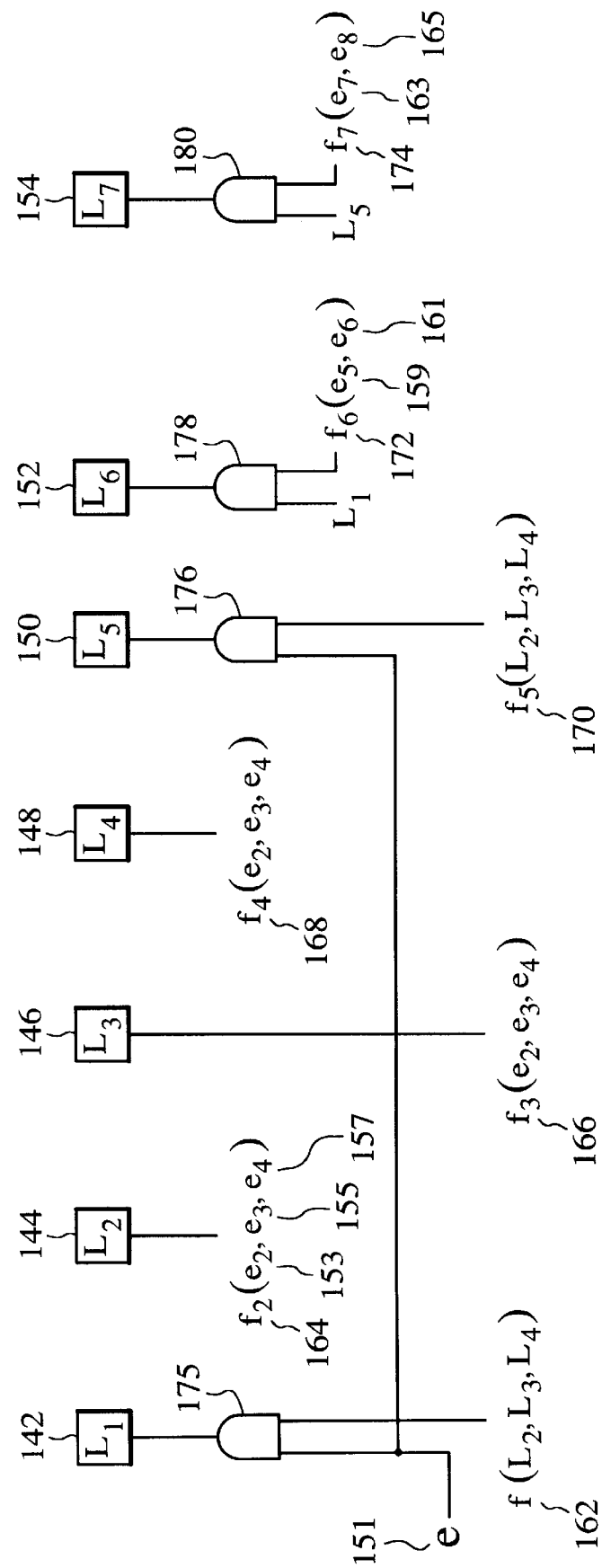
FIG. 2 is a block diagram illustrating a system for propagating constraints in an integrated circuit model.

FIG. 2 is a block diagram illustrating a system for propagating constraints in an integrated circuit model. To provide for ease in describing this feature of the present invention only a few latches and gates are shown. One of ordinary skill in the art readily recognizes however, that integrated circuit model may have millions of gates and this feature will significantly reduce the number of latches that must be analyzed. It should also be understood that the constraints could be a variety of types or combinations of types and their use would be within the spirit and scope of the present invention.

In this example, $L_1$–$L_7$ are latches 142–154, which receive external inputs 151–165 through boolean logic 162–174 ($F_1$–$F_7$). The boolean logic 162–174 is provided through either external inputs 151–165 ($e_1$–$e_8$) or through some combination of the other latches 142–154 and external inputs 151–165.

In this example, if $e_1$ is a zero, then the outputs of $L_1$ and $L_5$ are also a zero through operation of AND gates 175 and 176. Hence, latches $L_1$ and $L_5$ need not be evaluated and can be fixed to a constant value of zero. Next, if $L_5$ is fixed at zero, $L_6$ and $L_7$ can also be fixed at zero because $L_1$ and $L_5$ provide zero inputs to AND gates 178 and 180, which in turn provide inputs to $L_6$ and $L_7$. Accordingly, in this embodiment, only latches L2, L3 and L4 have to be simulated.

Referring back to FIG. 1, an algorithm to minimize the model for the integrated circuit is utilized to propagate the net invariants through the entire design and provide the reduced model, via step 108. The algorithm can be implemented utilizing conventional circuit synthesis techniques or could be implemented, for example, utilizing the minimization algorithm described in co-pending patent application Ser. No. 08/798,352, entitled "Method and System for Model Minimization of an Integrated Circuit, filed on Feb. 10, 1997, assigned to the assignee of the present application.

Thereafter the reduced model can be evaluated via simulation techniques, via step 110.

To provide a specific example, first a plurality of tests are generated for a particular integrated circuit. The tests are then restricted into 10 categories that include 5,000 instructions apiece. It is then determined that only two of those categories (10,000 instructions) are critical. In those two categories there are 150 net invariants. This information is then utilized by a minimization algorithm to provide a reduced model of the integrated circuit which can then be fully evaluated by a simulator.

In a preferred embodiment these invariants could be mapped from a larger space from the original model into a smaller space in the reduced model. In so doing, the integrated circuit can be more quickly evaluated.

Accordingly, the present invention combines the benefits of an event-driven simulation and cycle simulation by precomputing a reduced model of the integrated circuit based upon generated tests. In so doing the area of integrated circuit required for design verification is significantly reduced. If, for example, by a reduction process k out of N variables are reduced to constants, the amount of integrated circuit which must be measured is possibly reduced from $2^n$ to $2^{n-k}$. This exponential decrease in state space has a significant impact on the speed of simulation.

Although the system and method have been described in accordance with the embodiments shown, one of ordinary skill in the art will readily recognize that there could be variations to the embodiments and those variations would be within the spirit and scope of the above-described system and method. Accordingly, many modifications may be made by one of ordinary skill in the art without departing from the spirit and scope of the appended claims.

What is claimed is:

1. A method for verifying an integrated circuit model via simulation comprising the steps of:
   (a) precalculating a reduced model based upon net invariants of the integrated circuit, wherein the net invariants are based upon a restricted plurality of tests based on characteristics of the integrated circuit; and
   (b) evaluating the reduced model using cycle simulation wherein all gates in the reduced model is evaluated for each cycle.

2. The method of claim 1 which includes the step of providing a plurality of tests for simulating the integrated circuit.

3. The method of claim 2 in which the precalculating step (a) comprises the steps of:
   (a1) restricting the plurality of tests based on the characteristics of the integrated circuit to provide a restricted plurality of tests;
   (a2) providing a plurality of net invariants based upon the restricted plurality of tests; and
   (a3) minimizing the integrated circuit model size based upon the net invariants.

4. The method of claim 3 in which the restricting step (a1) comprises partitioning the tests into predetermined categories.

5. The method of claim 4 in which the providing step (a2) comprises providing the net invariants as constraints of the output of latches of the integrated circuit.

6. A method for reducing a model size of integrated circuit model comprising the steps of:
   (a) generating a plurality of tests for simulating the integrated circuit;
   (b) restricting the plurality of tests based on the characteristics of the integrated circuit to provide a restricted plurality of tests;
   (c) providing a plurality of net invariants based upon the restricted plurality of tests;
   (d) minimizing the integrated circuit model size based upon the net invariants;
   (e) evaluating the minimized integrated circuit model using cycle simulation wherein all gates in the minimized integrated circuit model is evaluated for each cycle.

7. The method of claim 6 in which the restricting step (b) comprises partitioning the tests into predetermined categories.

8. The method of claim 7 in which the providing step (c) comprises providing the net invariants as constraints of the output of latches of the integrated circuit.

9. The method of claim 6 in which step c) includes the step of generating invariants by translating the restricted plurality of tests to a smaller set of possible values for the net variables.

10. A system for verifying an integrated circuit model via simulation comprising:
    means for precalculating a reduced model based upon net invariants of the integrated circuit, wherein the net invariants are based upon a restricted plurality of tests based on characteristics of the integrated circuit; and
    means for evaluating the reduced model using cycle simulation wherein all gates in the reduced model is evaluated for each cycle.

11. The system of claim 10 which includes a means for providing a plurality of tests for simulating the integrated circuit.

12. The system of claim 10 in which the precalculating means comprises:
    means for restricting the plurality of tests based on the characteristics of the integrated circuit to provide a restricted plurality of tests;
    means for providing a plurality of net invariants based upon the restricted plurality of tests; and
    means for minimizing the integrated circuit model size based upon the net invariants.

13. The system of claim 12 in which the restricting means comprises means for partitioning the tests into predetermined categories.

14. The system of claim 13 in which the providing means comprises means for providing the net invariants as constraints of the output of latches of the integrated circuit.

15. A system for reducing a model size of integrated circuit model comprising:
    means for generating a plurality of tests for simulating the integrated circuit;
    means for restricting the plurality of tests based on the characteristics of the integrated circuit to provide a restricted plurality of tests;
    means for providing a plurality of net invariants based upon the restricted plurality of tests;
    means for minimizing the integrated circuit model size based upon the net invariants;
    means for evaluating the minimized integrated circuit model using cycle simulation wherein all gates in the minimized integrated circuit model is evaluated for each cycle.

16. The system of claim 15 in which the restricting means comprises means for partitioning the tests into predetermined categories.

17. The system of claim 16 in which the providing means comprises means for providing the net invariants as constraints of the output of latches of the integrated circuit.

18. A computer readable medium containing program instructions for verifying an integrated circuit model via simulation, the program instructions for:
    (a) precalculating a reduced model based upon net invariants of the integrated circuit, wherein the net invariants are based upon a restricted plurality of tests based on characteristics of the integrated circuit; and
    (b) evaluating the reduced model using cycle simulation wherein all gates in the reduced model is evaluated for each cycle.

* * * * *